United States Patent [19]

Nanzai

[11] Patent Number: 5,309,837
[45] Date of Patent: May 10, 1994

[54] METHOD FOR SCREEN PRINTING OF PASTE

[75] Inventor: Takashi Nanzai, Tokyo, Japan

[73] Assignee: Tani Denkikogyo Co., Ltd., Tokyo, Japan

[21] Appl. No.: 97,286

[22] Filed: Jul. 26, 1993

Related U.S. Application Data

[63] Continuation-in-part of Ser. No. 902,963, Jun. 23, 1992.

[30] Foreign Application Priority Data

Jun. 24, 1992 [JP] Japan .................................. 3-77831
Dec. 6, 1992 [JP] Japan .................................. 3-36040

[51] Int. Cl.$^5$ .................................. B41F 35/00
[52] U.S. Cl. .................................. 101/425; 101/129
[58] Field of Search ............... 101/119, 120, 123, 423, 101/425, 424, 129; 118/213, 241, 242, 256; 355/297

[56] References Cited

U.S. PATENT DOCUMENTS

| | | | |
|---|---|---|---|
| 762,165 | 6/1904 | Hainey | 101/120 |
| 2,027,102 | 1/1936 | Hommel et al. | 101/123 |
| 3,986,450 | 10/1976 | Zimmer | 101/425 |
| 4,433,623 | 2/1984 | Beckim | 101/425 |
| 5,070,782 | 12/1991 | Sakai et al. | 101/123 |

FOREIGN PATENT DOCUMENTS 1-19275  4/1989  Japan .
1-55597  11/1989  Japan .

Primary Examiner—Edgar S. Burr
Assistant Examiner—Ren Yan
Attorney, Agent, or Firm—McGlew and Tuttle

[57] ABSTRACT

A method for printing solder paste onto a surface of a printed circuit board through the medium of a screen having openings. The method includes feeding the paste into a chamber of a dispenser, dispensing the paste contained in the chamber onto a first side of the screen and onto the surface of the board from the dispenser through a slit-like aperture, removing paste residue from the first side of the screen by a blade extending from a first cleaning apparatus, removing paste residue from a second side of the screen by another blade extending from a second cleaning apparatus, and sucking and transporting the paste residue adhered to inner peripheral surfaces of openings in the screen as well as the paste residue being removed from the second side of the screen by a vacuum device connected to the second cleaning apparatus. The slit-like aperture of the dispenser is formed by a fixed front wall and a moveable rear wall selectively moving toward and away from the fixed front wall.

11 Claims, 7 Drawing Sheets

METHOD FOR SCREEN PRINTING OF PASTE

This is a continuation-in-part application of application Ser. No. 07/902,963, filed Jun. 23, 1992.

BACKGROUND OF THE INVENTION

1. Field of the Invention

The present invention relates generally to a method for dispensing viscous materials, and more particularly to a method for screen printing of solder paste onto a surface of a printed circuit board through the medium of a screen having a plurality of openings that is used in producing surface mount technology circuit boards.

2. Description of the Prior Art

There are various methods by which solder paste can be printed on a printed circuit board. One approach is to use the screen printing apparatus which has a spatula-like squeegee which is arranged to be displaced back and forth along a pair of parallel-oriented guide rails and is arranged to be raised and lowered relative to the guide rails. This screen printing apparatus is adapted to be in pressure contact with an upper surface of the screen when it is lowered and placed into a lower position where solder paste is printed onto a surface of a printed circuit board through the medium of the screen. This type of screen printing apparatus is disclosed in the Japanese Patent Gazette No. 1-55597 published on Nov. 27, 1989. In this type of screen printing apparatus, a considerable amount of solder paste is manually supplied onto the screen prior to operating the apparatus and the solder paste supplied onto the screen in such a way is printed on the surface of the circuit board by reciprocating the squeegee, while its lower end is pressed against the screen to introduce the solder paste into openings in the screen. Another screen printing apparatus similar to the above-mentioned type of apparatus is also disclosed in the Japanese Patent Gazette No. 1-19275 published on Apr. 11, 1989.

Major disadvantages of this type of screen printing apparatus are that as a considerable amount of solder paste placed on the screen is kept exposed to the air until the apparatus is put into operation, it tends to be solidified due to evaporation of flux contained therein and/or to be oxidized as it contains oxidizable components, such as lead. As the printing of solder paste is performed by reciprocating the squeegee, the solder paste tends to be excessively printed on a surface of the circuit board. As a result, printed films tends to be blurred on the surface of the circuit board and, in addition, a uniform printing effect cannot be obtained in every printing cycle. It is difficult to prevent the solder paste from acquiring of such changes as solidification, oxidation, etc., even if it is frequently kneaded on the screen with manual labour during the period when the apparatus is not in operation. To use such a solidified and/or oxidized solder paste brings about undesirable printing effect. For this reason, it must be removed from the screen and replaced with new solder paste. This means that a considerable amount of solder paste becomes a useless waste to be abandoned. In addition, replacement of solder paste not only requires the manual labour, but also requires printing operation to be stopped for a certain period of time. This results in an economic loss and worker exposure to lead which is a health concern.

A screen printing apparatus which is provided with an apparatus for cleaning solder paste residue from a lower surface of a screen having a plurality of openings therein is also already known. This type of apparatus is also disclosed in the Japanese Patent Gazette No. 1-19275 referred to above and is characterized by the provision of a paper-wrapped roller as a means for cleaning solder paste residue from the lower surface of the screen. The paper-wrapped roller is arranged to be reciprocated in a rolling engagement with the lower surface along a pair of guide rods in order to wipe off the residue adhered to the lower surface of the screen. A major disadvantage of this type of apparatus is that the paper-wrapped roller can only clean the residue from the lower surface and cannot clean the residue adhered to inner peripheral edges of the openings of the screen.

SUMMARY OF THE INVENTION

The present invention is intended to eliminate the disadvantages or drawbacks indicated with known methods carried out by the prior art as described above.

To these ends, in accordance with the present invention, there is provided a method for printing onto a surface of a board through a screen comprising the steps of:

feeding paste into a chamber of a dispenser from a paste supply device connected to the dispenser;

dispensing the paste contained in said chamber onto a first side of the screen and onto the surface of the board from the dispenser through a slit-like aperture therein;

removing residue from the first side of the screen by a transversely extending blade means extending from first cleaning apparatus so as to be in contact with the first side of the screen;

removing residue from a second side of the screen by a transversely extending blade means extending from second cleaning apparatus so as to be in contact with the second side of the screen; and sucking and transporting the residue adhered to inner peripheral surfaces of openings in said screen as well as the residue being removed from the second side of said screen by a vacuum means connected to the second cleaning apparatus.

It is, therefore, one object of the present invention to provide a method for printing onto a surface of a board through a screen which is capable of preventing the paste to be printed on the surface of the board from being solidified and/or oxidized.

It is another object of the present invention to provide a paste printing method of the kind described above which is capable of dispensing a predetermined amount of solder paste having a predetermined degree of visiosity and temperature onto the upper surface of the screen in each printing cycle.

It is a further object of the present invention to provide a paste printing method of the kind described above which is capable of preventing the paste to be printed from being excessively supplied onto the surface of the screen.

It is another object of the invention to provide a paste printing method of the kind described above which is capable of obtaining uniform and precise printing effect in every printing cycle.

It is another object of the invention to provide a paste printing method of the kind stated above which is capable of minimizing the amount of the paste to be wasted.

It is a further object of the invention to provide a paste printing method of the kind stated above which is capable of economically performing printing operation and of protecting workers from being exposed to detrimental substance contained in the paste, such as lead.

It is a further object of the invention to provide a paste printing method of the kind stated which includes the steps of effectively cleaning paste residue from the screen.

The various features of novelty which characterize the invention are pointed out with particularity in the claims annexed to and forming a part of this disclosure. For a better understanding of the invention, its advantages and specific objects attained by its uses, reference is made to the accompanying drawings and descriptive matter in which screen printing apparatuses for carrying out the method of the invention are illustrated.

DETAILED DESCRIPTION

Figure 1:
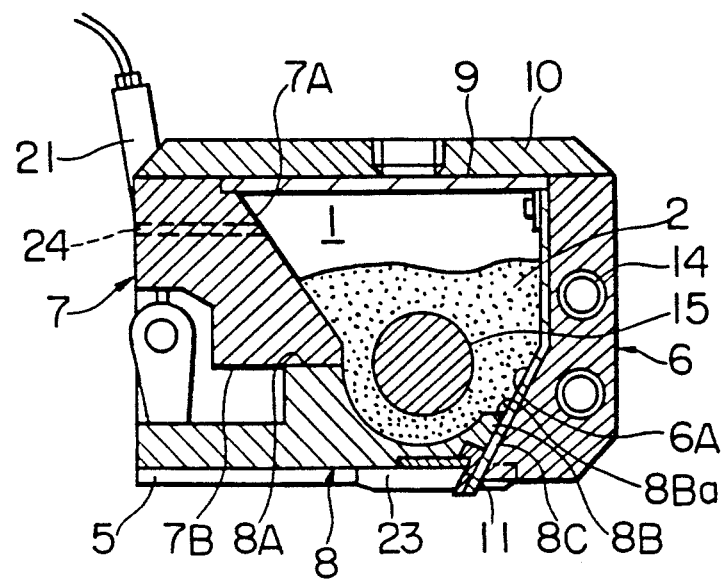
FIG. 1 is a vertical cross-sectional side view, in a simplified form, of a solder paste automatic supply dispenser to carry out the method of the present invention, showing the state in which a slit-like aperture is closed.
Figure 2:
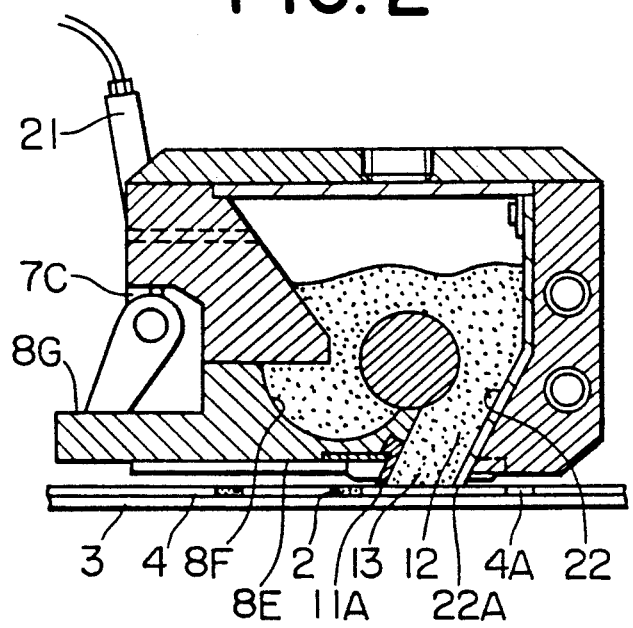
FIG. 2 is a view similar to FIG. 1, showing the state in which the slit-like aperture is open.
Figure 3:
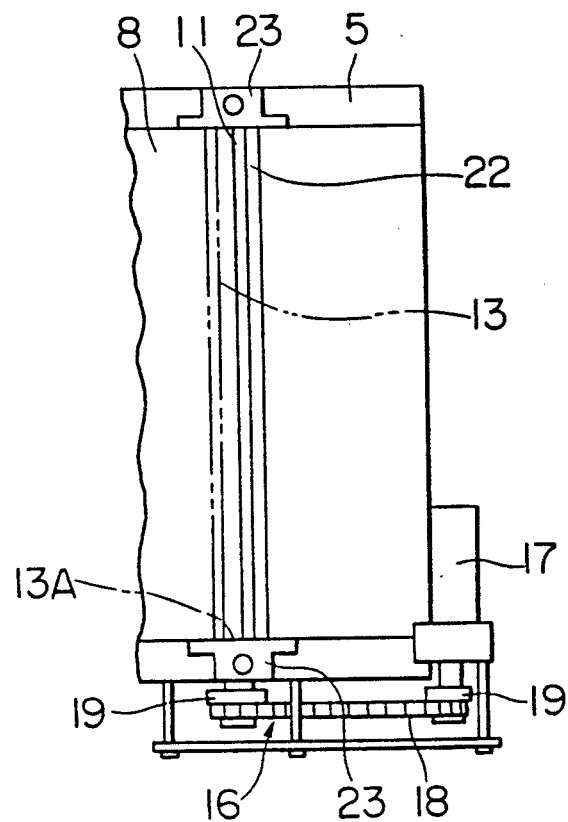
FIG. 3 is a bottom view, in a simplified form, of the dispenser.

Referring to FIGS. 1, 2 and 3, there is shown a screen printing apparatus to carry out the method of the present invention. The apparatus comprises a solder paste automatic supply dispenser A of a nonflexible box-like structure which is arranged to be moved along a pair of guide rails back and forth and to be raised and lowered relative to the guide rails. The dispenser is provided with a chamber 1 for containing solder paste 2 to be printed on a surface of a printed circuit board 3 through a screen 4 formed of a metal plate, such as a stainless steel plate. The screen 4 has openings 4A and is positioned on the circuit board 3, which is placed on a printing table, not shown, in a well known manner.

The chamber 1 is defined by a pair of relatively thick side walls 5 parallel to each other and extending parallel to the direction of travel of the dispenser A. A front wall block 6 is fixedly secured at sides thereof to inner surfaces of forward portions of the side walls 5 and extends perpendicular to side walls 5. The front wall block has at a lower portion thereof a rearwardly inclined transversely extending inner surface 6A. A rear wall block 7 is fixedly secured at sides thereof to inner surfaces of rearward portions of the side walls 5 and extends parallel to the front wall block 6. The rear wall block is relatively shorter than the front wall block 6 in vertical length and has a forwardly inclined transversely extending inner surface 7A with a horizontal bottom surface 7B. A movable bottom wall block 8 is movable toward and away from the front wall block 6 and is in sliding contact at sides thereof with the inner surfaces of the side walls 5 and at a top surface 8A thereof with the bottom surface 7B of the rear wall block 7. A removable lid 9 covers the upper end of the chamber. Reference numeral 10 is a top cover which is removably secured to top surfaces of surrounding walls 5, 6, 7. These walls 5, 6, 7 can be formed either of light metal, such as aluminum or of transparent synthetic resin.

The movable bottom wall block 8 is formed, at a front end portion 8B having a curved upper surface 8Ba, with a rearwardly inclined transversely extending inner surface 8C parallel to the inclined inner surface 6A of the front wall. In the illustrated dispenser, the inclined inner surface 8C is provided with a transversely extending recess 8D in which a transversely extending squeegee blade 11 is securely mounted along the entire length thereof in such a manner that a lower straight edge 11A thereof projects slightly downwardly of the lower surface 8E of the movable bottom wall 8 along the plane of the inclined inner surface thereof. In the illustrated dispenser, the squeegee blade 11 is formed of synthetic resin or rubber having excellent mechanical strength as well as excellent chemical resistant properties, such, for example, as reinforced nylon or the like. It is to be noted, however, that the squeegee blade can be integrally formed with the bottom wall 8 at its front end 8B, in the event that the bottom wall 8 is to be formed of synthetic resin. Thus, since the inclined inner surface 8C of the bottom wall 8 and the inclined inner surface 6A of the front wall 6 are parallel to and opposite to each other, there is formed therebetween a transversely extending passage 12 which terminates in a transversely extending slit-like aperture 13 at its lower extremity. These passage 12 and slit-like aperture 13 are closed when the bottom wall 8 is in contact with the front wall 6 at its inclined inner surface 8C and opened when the former is moved away from the latter. In the present invention, the slit-like aperture 13 is arranged to be normally closed and to be kept open during printing, which will be described in detail later.

The solder paste automatic supply dispenser A is provided with a temperature adjusting device for adjusting the temperature of the paste 2 contained in the chamber 1 of the dispenser A to maintain the same at a predetermined degree, for example 25° C. In the illustrated dispenser, this device comprises a pipe 14 through which circulating water flows, the pipe being incorporated into the front wall block 6 of the dispenser and connected via flexible circulating pipes, not shown, to a circulating pump device installed outside the apparatus. This adjusting device makes it possible to adjust the solder paste temperature depending upon changes in room temperature to thereby hold down the change in the solder paste contained in the chamber 1 at a relatively low cost.

The solder paste automatic supply dispenser A is also provided with a rotatable member 15 in the form of a relatively heavy metal cylinder which is arranged to be driven for rotation by means of a motor-driven mechanism 16 mounted on the dispenser structure to knead the solder paste 2 contained in the chamber 1 so that the solder paste can have a desired degree of viscosity for printing. The mechanism 16 comprises an electric motor 17 and a chain gearing 18 with sprocket wheels 19, as shown in FIG. 3.

Figure 6:
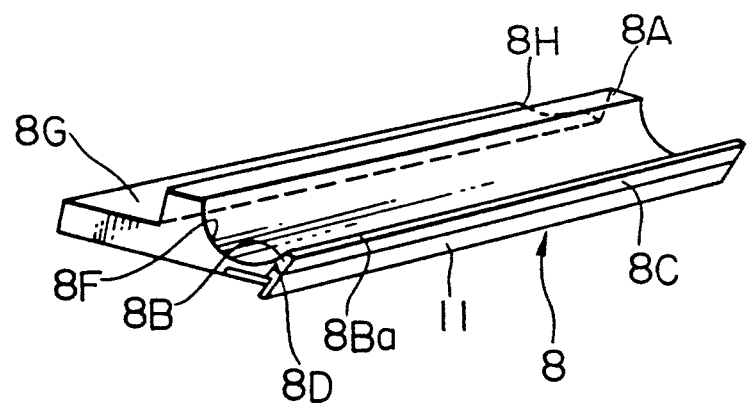
FIG. 6 is a perspective view of a bottom wall block of the dispenser.

The bottom wall block 8 of the dispenser is provided with a transversely extending arcuately curved recess 8E between its front end 8B and its top surface 8A and a transversely extending depression 8G behind the top surface 8A. The depression 8G is provided with a cut-out portion 8H at one end adjacent to one of the side walls 5, as shown in FIG. 6. The bottom wall block 8 is provided with a link arm 20 which is pivoted at its lower end to the cut-out portion 8H so as to be pivotable about a horizontal axis for a predetermined angular range. This link arm 20 constitutes a part of a drive mechanism for moving the bottom wall block 8 toward and away from the front wall block 6 to close and open the slit-like aperture 13 formed at the lower end of the chamber 1 of the solder paste automatic supply dispenser A. The link arm 20 is operatively connected, at its upper end which projects into a recess 7C of the rear wall block 7, to a known crank mechanism, not shown. The link arm 20 is arranged to be operated by a pneumatic cylinder 21 supported on the outer side of a side wall 5, whereby when the cylinder 21 is actuated, the bottom wall block 8 is caused to be moved toward or away from the front wall 6 along and between the side walls 5 to close or open the aperture 13, together with the squeegee blade 11.

In the illustrated dispenser, the slit-like aperture 13 is further provided, at its front edge portion, with a blade 22 which extends along the entire length of the aperture in parallel relationship with the squeegee blade 11. The blade 22 cooperates with the squeegee blade to define the aperture 13 through which the solder paste 2 is supplied from the chamber 1 onto the upper surface of said screen 4. This blade 22 is also made of a material similar to that of the squeegee blade 11 and can also be integrally formed with the front wall block 6 at its rear bottom portion along the rearwardly inclined surface 6A, if the front wall is to be formed of synthetic resin. The side walls 5 are provided, at their lower surfaces, with leak-preventing members 23 respectively for preventing the solder paste 2 contained in the chamber 1 from leaking out from lower side openings 13A of the slit-like aperture 13 during the period when the aperture 13 is kept open for printing. The leak-preventing members 23 are made of a material similar to those of the blades 11, 22 and are in sliding contact with the lower side portions of the two blades 11, 22 at their inner surfaces, as shown in FIG. 3.

Reference numeral 24 is an opening which pierces through the rear wall block 7 for feeding solder paste into the chamber 1 from outside of the dispenser A when the amount of the solder paste 2 remaining in the chamber has been reduced. This opening 24 is connected to a solder paste supply device, not shown, via a flexible tube, not shown, so that paste can be fed into the chamber 1 therefrom.

Figure 4:
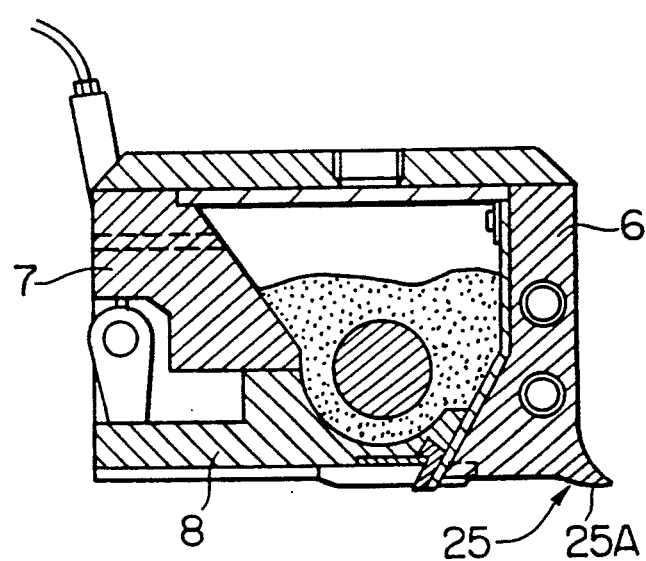
FIG. 4 is a vertical cross-sectional side view, in a simplified form, of a variant of the dispenser, showing the state in which the slit-like aperture is closed.
Figure 5:
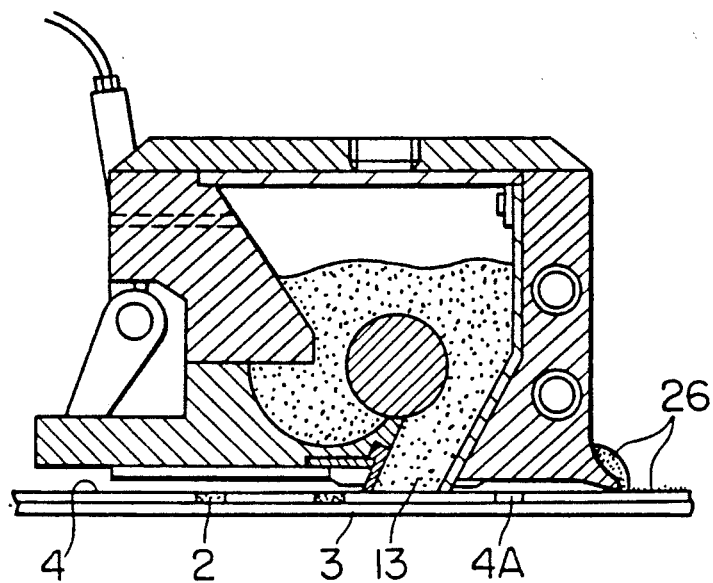
FIG. 5 is a view similar to FIG. 4, illustrating the state in which the aperture is open.

FIGS. 4 and 5 show a variant A' of the dispenser A shown in FIGS. 1 to 3. This dispenser A' is provided with a cleaning device 25 of a simple construction for cleaning a residue of the solder paste 26 from the upper surface of the screen 4. This device 25 comprises a scraper projection 25A which projects forwardly downward from a lower portion of the front wall 6 and extends normal to the direction of travel of the dispenser A' so that the solder paste residue 26 adhered to the upper surface of the screen 4 can be scraped off as the dispenser is lowered from above to a starting position for printing and travels forward along the screen. The scraper projection 25A can either be integrally formed with the front wall block 6 or separately formed, using synthetic resin.

Figure 7:
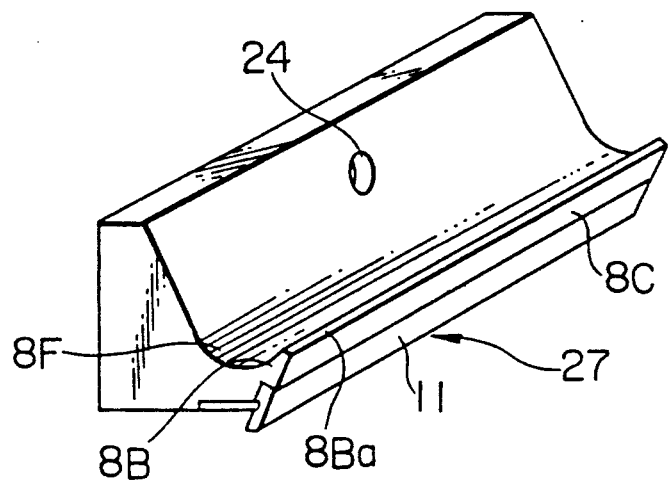
FIG. 7 is a perspective view of a wall block which can be substituted for the bottom wall block and a rear wall block of the dispenser.

It should be noted that the rear wall block 7 and the bottom wall block 8 can be integrally formed with each other into one movable wall block 27, as shown in FIG. 7. In case where such a wall block 27 is used, instead of the two blocks 6, 7, it is preferable that a pneumatic cylinder is horizontally mounted along one of the side walls 5 so that its piston rod can impart to the block 27 a rectilinear motion to move it toward and away from the front wall 6 without the provision of a slider crank mechanism or the like. In FIG. 7, portions of the movable wall block 27 which correspond to those of the movable bottom wall 8 are shown by like reference numerals.

Operation of the dispenser shown in FIGS. 1 to 3 will be described in connection with operation of other apparatuses to carry out the method of the invention as will be described hereunder with reference to FIGS. 8 through 14.

FIGS. 8 through 14 show a screen printing system which comprises, in combination, a solder paste automatic supply dispenser of the type described with reference to FIGS. 1 to 7, a first apparatus B for cleaning the solder paste residue from the upper surface of said screen and a second apparatus C for cleaning the solder paste residue from a lower surface and from openings 4A of said screen.

Figure 8:
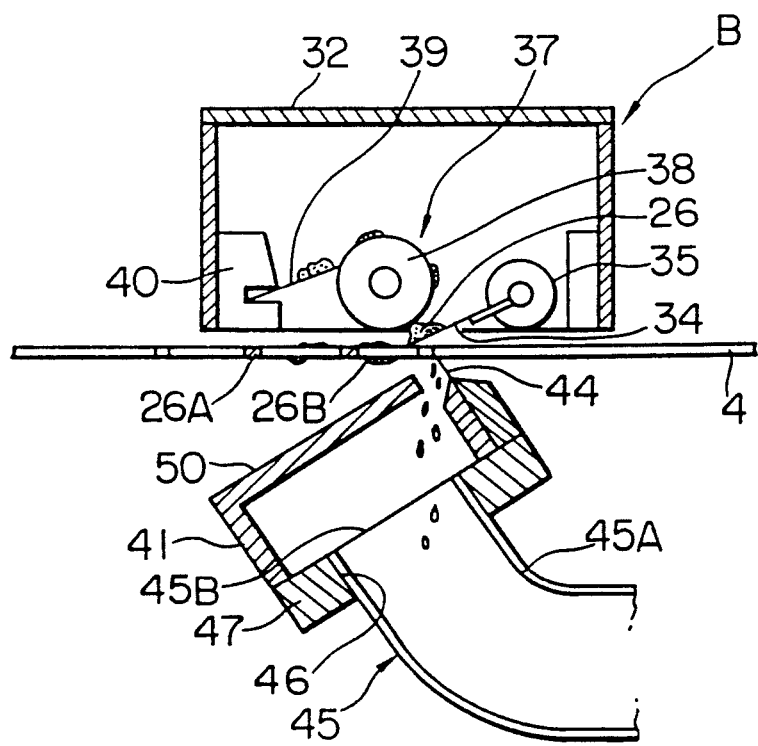
FIG. 8 is a vertical cross-sectional side view, in a simplified form, of apparatuses for cleaning solder paste residue from the screen which cooperate with the dispenser to carry out the method of the present invention, illustrating the state in which they are performing cleaning operations.
Figure 9:
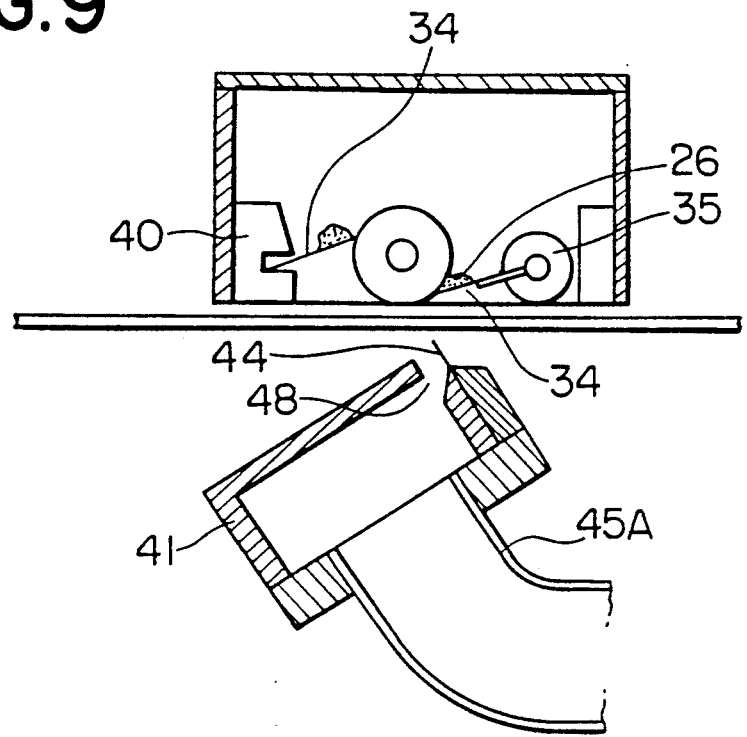
FIG. 9 is a view similar to FIG. 8, showing the state in which they are in an inoperative position.
Figure 10:
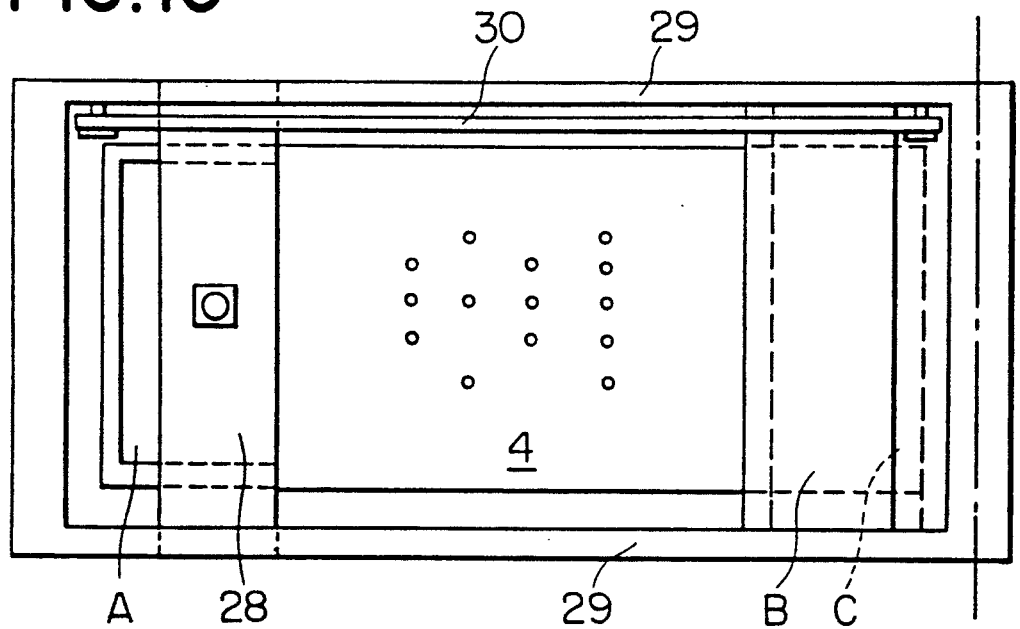
FIG. 10 is a plan view, in a simplified form, of the dispenser.

The dispenser A is supported by a carriage 28 slidably mounted on a first pair of parallel-oriented guide rails 29 and arranged to be moved therealong back and forth by means of a belt drive 30. The dispenser A is arranged to be raised and lowered relative to the first guide rails by means of a pneumatic cylinder 31. The first cleaning apparatus B comprises an apparatus housing 32 of a nonflexible structure which is arranged along a second pair of parallel-oriented guide rails 33 situated underneath the first pair of guide rails 29 back and forth between two predetermined positions by means of a rack and pinion mechanism, not shown. A first transversely extending cleaning blade 34 is provided within the housing 32 and arranged to be brought into sliding contact with the upper surface of the screen 4 to remove the solder paste residue therefrom when the apparatus is actuated at a first position for cleaning operation. The cleaning blade 34 is to be detached from the surface at a second position where cleaning operation is completed. As shown in FIG. 8, the blade 34 is fixed to a cylindrical member 35 and projects radially outwardly therefrom. The cylindrical member extends transversely, is rotatably supported on side walls of the housing 32 and is arranged to be rotated in opposite directions within a predetermined angular range by means of a pneumatically operated drive 36. The cleaning apparatus B further comprises a collecting device 37 for collecting the solder paste residue 26 removed from the upper surface of the screen 4 by the blade 34. The collecting device 37 comprises a residue transfer roller 38 which extends transversely in parallel relationship with the cylindrical member 35, is rotatably supported on the housing 32 and is arranged to be rotated anti-clockwise by a drive mechanism, not shown. A transversely extending residue receiving plate 39 which is removably supported at one end by a mount 40 within the housing 32 is in sliding contact with a peripheral surface of the residue transfer roller 38 at the other end.

The second cleaning apparatus C comprises an apparatus casing 41 of a nonflexible closed box type which is arranged along a third pair of parallel-oriented guide rails 42 situated underneath said second pair of guide rails 33 and movable back and forth by means of a belt drive, not shown. The second cleaning apparatus C is raised and lowered relative to the rails by means of a pneumatic cylinder 43. A second transversely extending cleaning blade 44 is mounted on the casing 41 and arranged to be brought into sliding contact with a lower surface of the screen 4 to remove the solder paste residue therefrom when the apparatus is actuated at a first position for cleaning operation. The blade 44 is detached from the surface at a second position when cleaning operation is completed. The second cleaning apparatus C further comprises a device 45 to suction the solder paste residue 26A adhered to inner peripheral surfaces of openings 4A in the screen 4 as well as the solder paste residue 26B being removed from the lower surface of the screen 4 by the second blade 44 by the suction of an air current. This device 45 comprises a suction tube 45A an inlet 45B of which is opened into the casing 41 through an opening 46 formed in a bottom wall 47 thereof. An outlet of the suction tube 45, not shown, is connected to a vacuum cleaner or other pneumatic device, not shown, for suctioning pieces of the solder paste.

Reference numeral 48 is a suction aperture formed between a rear wall 49 on which the blade 44 is mounted and an upper wall 50 and extending transversely along the blade 44 so that the solder paste residue can be suctioned therethrough during cleaning. The first and second blades 34 and 44 are preferably formed of syntheric resin, such as reinforced nylon or the like so that the surface of the screen 4 can be protected from being abraded.

Figure 11:
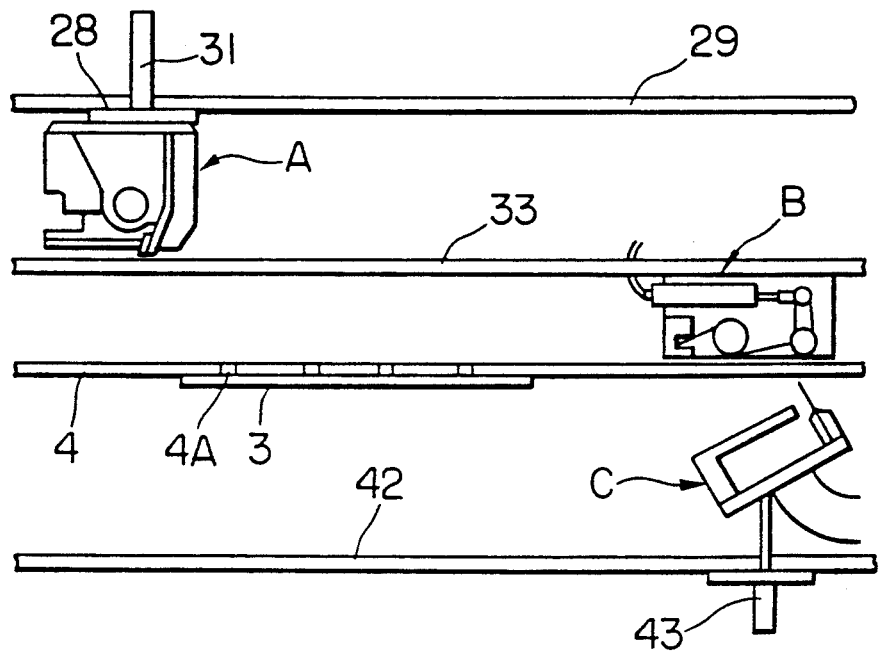
FIG. 11 through 14 are schematic side views, each illustrating the manner in which the dispenser and the cleaning apparatuses are operated, respectively.
Figure 12:
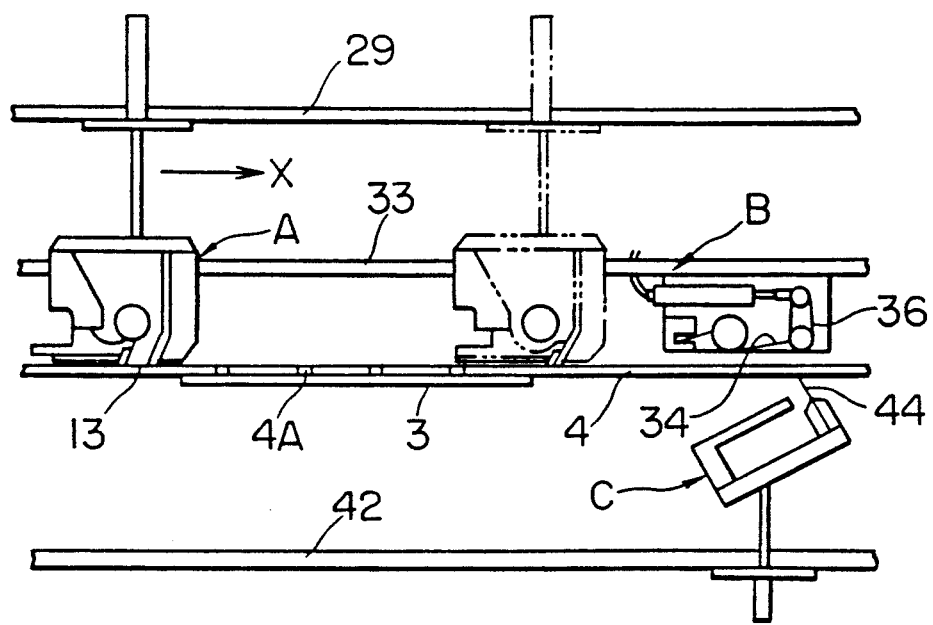

In operation, the solder paste automatic dispenser A is, when at rest, in an initial position shown in FIG. 11 and from there it is lowered and placed into a second position shown in FIG. 12 to start printing. When the dispenser A is placed into this position, the slit-like aperture 13 is opened by moving the bottom wall 8 away from the front wall 6 so as to be capable of supplying solder paste 2 contained in the chamber 1 of the dispenser onto the upper surface of screen 4. At the same time, the rotatable metal cylinder 15 is made to rotate clockwise in the state in which its peripheral surface is in sliding contact with the upper surface 8B*a* of front end portion 8B of bottom wall 8 to knead solder paste 2 and to apply a pressure against it so as to facilitate supply of the same. The dispenser A is made to travel forwardly, i.e. in the direction of arrow X, with the lower end 11A of the squeegee blade 11 and the lower end 22A of the opposite blade 22 being in sliding contact with the upper surface of screen 4. As the squeegee blade 11 passes each of the openings 4A in screen 4, a predetermined amount of the solder paste supplied out of the chamber 1 is applied and filled into the openings 4A by the squeegee blade 11, whereby the openings 4A are filled with the solder paste 2. After the squeegee blade 11 has passed all the openings 4A and reached a third position where it is shown in phamtom lines in FIG. 12, the aperture 13 is closed, rotation of the cylinder 15 is stopped and the printed circuit board 3 is downwardly moved with a printing table, not shown, in a well known manner so that the screen 4 and the circuit board 3 are separated from each other and printed films of solder paste having a pattern corresponding to the pattern of the openings 4A of the screen 4 are left on the circuit board 3.

The solder paste automatic supply dispenser A' shown in FIGS. 4 and 5 as a variant of the dispenser A is capable of cleaning the solder paste residue 26 adhered to the upper surface of screen 4 by scraping off the residue 26 by the scraper projection 25 as it travels forward on the screen for printing. Cleaning of the residue is performed immediately before printing occurs, since the scraper 25 is provided forwardly of the slit-like aperture 13, thereby enabling the solder paste 2 supplied in a well kneaded state to be prevented from being mixed with the residue 26. Other functions and manner of operation of this dispenser A' are the same as those of the dispenser A.

Figure 13:
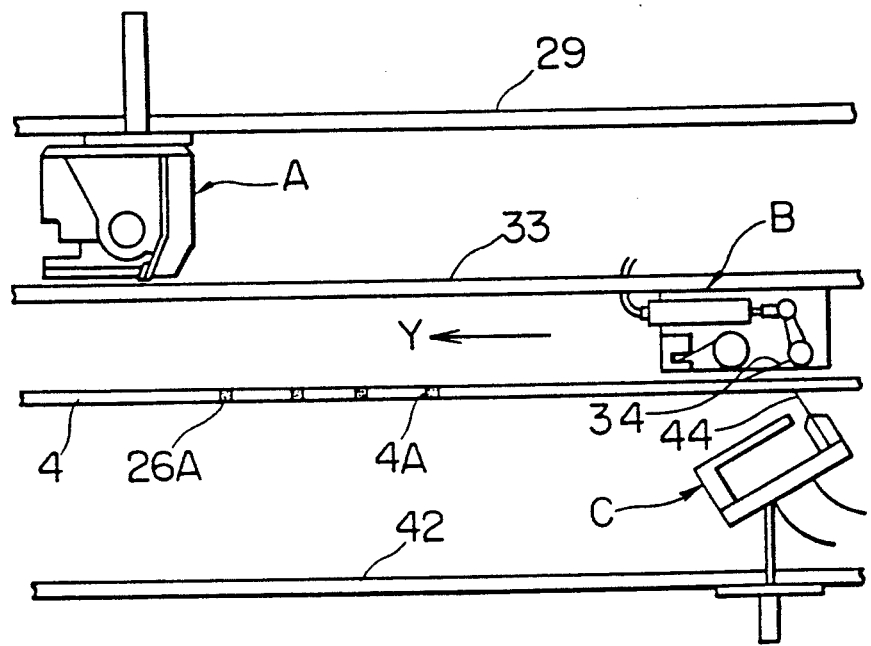

Next, after the slit-like aperture 13 has been closed, the dispenser A is raised and returned to the original position from the aforementioned third position to complete one printing cycle. The first and second cleaning apparatuses B and C are, when at rest, in their original positions spaced apart from the original position of the dispenser A, as indicated in FIG. 11. When the apparatuses B and C are at rest, the first cleaning blade 34 of apparatus B and the second cleaning blade 44 of apparatus C are disengaged from the upper and lower surfaces of the screen 4, respectively, as shown in FIGS. 11 and 12. More specifically, on one hand, the first blade 34 is retracted into housing 32 of first apparatus B and, on the other hand, the second blade 44 is positioned underneath the screen 4, and then, as the dispenser A has been returned to its original position and the circuit board 3 separated from screen 4 and moved away therefrom, the first and second blades 34 and 44 are brought into contact with the upper and lower surfaces of the screen 4, respectively, that is, the first blade 34 is rotated counter-clockwise to come into contact with the upper surface and the second blade 44 is raised with the casing 41 to come into contact with the lower surface, as shown in FIG. 13.

As the first and second blades 34 and 44 contact the surfaces respectively, the apparatuses B and C are substantially simultaneously made to travel in the direction of arrow Y to remove the solder paste residue from the upper and lower surfaces of the screen 4 and from the openings 4A in the screen 4 by means of the blades 34 and 44 and the aforementioned suction device 45. By employing the two cleaning apparatuses B and C which work together, the solder paste residue can be effectively cleaned not only form the upper and lower surfaces of screen 4, but also from the openings 4A therein, whereby fresh solder paste can be uniformly and precisely printed onto the circuit board 3 through the cleaned openings 4A.

In the first apparatus B, the solder paste residue 26 removed from the upper surface and built up the upper surface of the blade 34 during cleaning comes into contact with a peripheral surface of the residue transfer roller 38 and is adhered thereto by its viscosity, so that it is transferred onto the residue receiving plate 39 by the transfer roller 38 which is arranged to be rotated counter-clockwise. The residue 26 piled up the receiving plate 39 is made possible to be easily disposed by detachment of the plate 39. In the second apparatus C, the residue 26A in the openings 4A and the residue 26B scraped off by the blade 44 are suctioned and collected by the suction device 45 for disposal.

Figure 14:
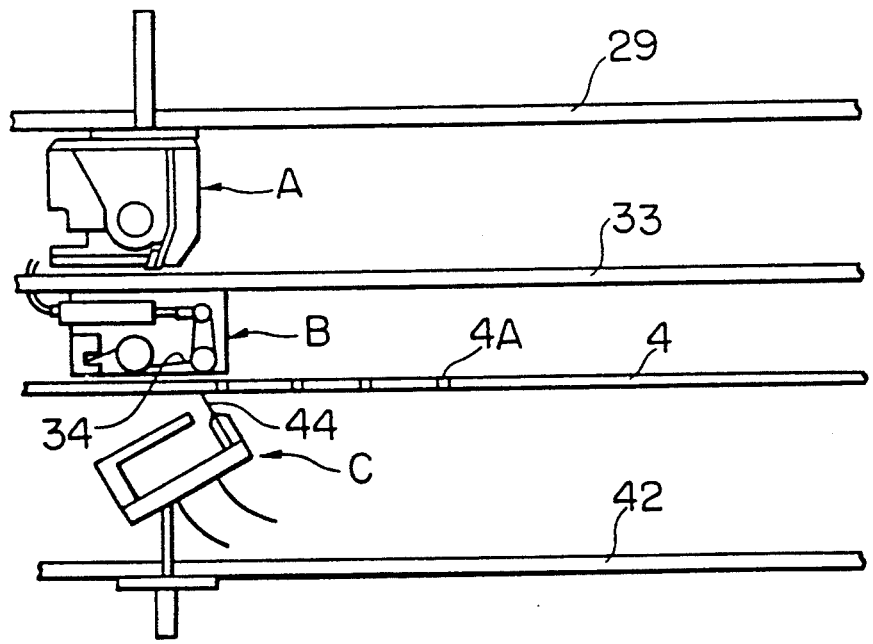

As the apparatuses B and C finish cleaning and reach positions underneath the original position of the dispenser A as shown in FIG. 14, the first blade 34 is turned clockwise and returned to its original position and the second blade 44 is lowered and disengaged from the lower surface of screen 4. Thereafter, the apparatuses B and C are returned to their original positions to complete one cleaning cycle.

Mechanisms used for operating the solder paste automatic supply dispenser A and the first and second cleaning apparatuses B and C are sequentially controlled by a sequential control unit including a control circuit arrangement, not shown.

It is to be understood that the present invention may be embodied in other specific forms without departing from the spirit or essential characteristics of the present invention. The preferred embodiments are therefore to be considered illustrative and not restrictive. The scope of the invention is indicated by the appended claims rather than by the foregoing descriptions and all changes or variations which fall within the meaning and range of the claims are intended to be embraced therein.

What is claimed is:

1. A method for printing onto a surface of a board through a screen comprising the steps of:
    feeding paste into a chamber of a dispenser from a paste supply device connected to the dispenser;
    dispensing the paste contained in said chamber onto a first side of the screen and onto the surface of the board from the dispenser through a slit-like aperture therein;
    removing residue from the first side of the screen by a transversely extending blade means extending from first cleaning apparatus so as to be in contact with the first side of the screen;
    removing residue from a second side of the screen by a transversely extending blade means extending from second cleaning apparatus so as to be in contact with the second side of the screen; and
    sucking and transporting the residue adhered to inner peripheral surfaces of openings in said screen as well as the residue being removed from the second side of said screen by a vacuum means connected to the second cleaning apparatus.

2. A method for printing onto a surface of a board as claimed in claim 1, further including the steps of:
    kneading the paste contained in said chamber by a rotatable means provided within said chamber so that the paste can have a desired degree of viscosity for printing; and
    adjusting temperature of the paste contained in said chamber by temperature adjusting means attached to the dispenser means so as to maintain said temperature at a predetermined value.

3. A method for printing onto a surface of a board through a screen as claimed in claim 1, wherein removing the residue from the second side of the screen is performed substantially simultaneously with removing the residue from the first side of the screen.

4. A method for printing onto a surface of a board through a screen as claimed in claim 1, further including the step of collecting the residue removed from the first side of the screen for disposal.

5. A method for printing onto a surface of a board through a screen comprising the steps of:
    feeding paste into a chamber of a dispenser from a paste supply device via a tube connected to the dispenser;
    kneading the paste contained in said chamber by a rotatable means provided within said chamber so that the paste can have a desired degree of viscosity for printing;
    adjusting temperature of the paste contained in said chamber by temperature adjusting means attached to the dispenser so as to maintain said temperature at a predetermined value;
    dispensing the paste onto a first side of the screen and onto the surface of the board from the dispenser through a slit-like aperture therein;
    removing residue from the first side of the screen by a scraper means projecting forwardly downward from a lower portion of a front wall of the dispenser;
    removing residue from a second side of the screen by a transversely extending blade means extending from a cleaning apparatus so as to be in contact with the second side of the screen; and
    sucking and transporting the residue adhered to inner peripheral surfaces of openings in said screen as well as the residue being removed from the second side of said screen by a vacuum means connected to the cleaning apparatus.

6. A method for printing solder paste onto a surface of a printed circuit board through a screen comprising the steps of:
    feeding solder paste into a chamber of a dispenser from a solder paste supply device via a tube connected to the dispenser;
    kneading the paste contained in said chamber by a rotatable means provided within said chamber so that the paste can have a desired degree of viscosity for printing;
    adjusting temperature of the paste contained in said chamber by temperature adjusting means attached to the dispenser so as to maintain said temperature at a predetermined value;
    applying a pressure against the paste contained in said chamber by said rotatable means to facilitate the paste to be dispensed onto a first side of the screen from the dispenser through a slit-like aperture therein;
    dispensing the paste onto the first side of the screen and onto the surface of the printed circuit board from the dispenser through said aperture;
    removing residue from the first side of the screen by a transversely extending blade means extending from first cleaning apparatus so as to be in contact with the first side of the screen;
    removing residue from a second side of the screen by a transversely extending blade means extending from second cleaning apparatus so as to be in contact with the second side of the screen; and
    sucking and transporting the residue adhered to inner peripheral surfaces of openings in said screen as well as the residue being removed from the second side of said screen by a vacuum means connected to the second cleaning apparatus.

7. A method for printing solder paste onto a surface of a printed circuit board through a screen as claimed in claim 6, further including the step of refilling said chamber with solder paste by means of said solder paste supply device when the solder paste remaining in said chamber has been reduced.

8. A method for printing solder paste onto a surface of a printed circuit board through a screen comprising the steps of:

feeding solder paste into a chamber of a dispenser from a solder paste supply device via a tube connected to the dispenser;

kneading the paste contained in said chamber by a rotatable means provided within said chamber so that the paste can have a desired degree of viscosity for printing;

closing a slit-like aperture communicating with said chamber by actuating means mounted on the dispenser when the dispenser is in a non-printing position, said slit-like aperture being formed between a fixed front wall and a movable rear wall of the dispenser the rear wall of which is movable toward and away from the fixed front wall;

opening said slit-like aperture by said actuating means when the dispenser is performing a printing operation so that the paste contained in said chamber is permitted to be dispensed onto a first side of the screen during each pass of the dispenser;

applying a pressure against the paste contained in said chamber by said rotatable means to facilitate the paste to be dispensed onto the first side of the screen from the dispenser through said slit-like aperture and through a space between a pair of blades extending from the dispenser on opposite sides of said slit-like aperture for contact with the first side of said screen;

moving the dispenser in a direction of travel thereof so that a trailing one of said blades urges the paste dispensed from the dispenser through openings in said screen and onto the surface of said printed circuit board.

9. A method for printing solder paste on to a surface of a printed circuit board through a screen as claimed in claim 8, further including the step of: adjusting temperature of the paste contained in said chamber by temperature adjusting means attached to said dispenser so as to maintain said temperature at a predetermined value.

10. A method for printing solder paste onto a surface of a printed circuit board through a screen as claimed in claim 8, further including the steps of:

removing residue from the first side of the screen by a transversely extending blade means extending from first cleaning apparatus so as to be in contact with the first side of the screen;

removing residue from the second side of the screen by a transversely extending blade means extending from second cleaning apparatus so as to be in contact with the second side of the screen; and sucking and transporting the residue adhered to inner peripheral surfaces of openings in said screen as well as the residue being removed from the second side of said screen by a vacuum means connected to the second cleaning apparatus.

11. The method according to claim 10, wherein removing the residue from the first side of the screen, removing the residue from the second side of the screen and sucking and transporting the residue adhered to inner peripheral surfaces of openings in said screen as well as the residue being removed from the second side of the screen are substantially simultaneuously performed.

* * * * *